United States Patent
Rebec et al.

(10) Patent No.: US 9,558,404 B2
(45) Date of Patent: Jan. 31, 2017

(54) METHOD AND DEVICE FOR FILTERING ELECTRICAL CONSUMPTION CURVES AND ALLOCATING CONSUMPTION TO CLASSES OF APPLIANCES

(75) Inventors: Gaëlle Rebec, Le Pradet (FR); Yves Lacroix, Hyeres (FR)

(73) Assignee: UNIVERSITE DU SUD TOULON VAR, La Garde (FR)

( * ) Notice: Subject to any disclaimer, the term of this patent is extended or adjusted under 35 U.S.C. 154(b) by 1503 days.

(21) Appl. No.: 13/254,294

(22) PCT Filed: Mar. 20, 2010

(86) PCT No.: PCT/FR2010/000233
§ 371 (c)(1),
(2), (4) Date: Nov. 21, 2011

(87) PCT Pub. No.: WO2010/106253
PCT Pub. Date: Sep. 23, 2010

(65) Prior Publication Data
US 2012/0059607 A1    Mar. 8, 2012

(30) Foreign Application Priority Data
Mar. 20, 2009    (FR) ...................................... 09 01311

(51) Int. Cl.
*G06F 19/00*    (2011.01)
*G06K 9/00*    (2006.01)
(Continued)

(52) U.S. Cl.
CPC ............... *G06K 9/0055* (2013.01); *H02J 3/00* (2013.01); *G01R 21/133* (2013.01);
(Continued)

(58) Field of Classification Search
CPC .............. G01R 21/133; G01R 21/1331; G01R 21/1336; G01R 21/1338; H02J 3/00; H02J 2003/003; G06K 9/0055; G06N 99/005; G06N 3/02; G06F 15/18; G06Q 50/06; Y04S 20/222; Y02B 70/3225; Y02B 70/30

See application file for complete search history.

(56) References Cited

U.S. PATENT DOCUMENTS 4,858,141 A     8/1989  Hart et al.
2003/0093390 A1*  5/2003  Onoda ................... G01R 22/00
                                        705/412

OTHER PUBLICATIONS

Norford et al., "Non-intrusive electrical load monitoring in commercial buildings based on steady-state and transient load-detection algorithms", Energy and Buildings, 1996, pp. 51-64, vol. 24.
(Continued)

*Primary Examiner* — Sujoy Kundu
*Assistant Examiner* — L. Anderson
(74) *Attorney, Agent, or Firm* — Buchanan Ingersoll & Rooney PC

(57) ABSTRACT

The invention relates to a method for analyzing the electrical consumption of a plurality of electrical appliances operating on a consumption site, by filtering a demand curve representing the electrical consumption of said appliances according to time. Said method is characterized in that it comprises the following steps: before the filtering per se of the demand curve, the demand curve is recorded and digitalized in such a way as to obtain a demand curve digitalized by periods of time; a set of categories of appliances is defined, each category being defined by similar cycles of power variation according to the time; an algorithm is defined for each category of appliances, for filtering the demand curve for said category of appliances, said algorithm being able to extract the power variation cycles from the digitalized demand curve and to allocate the electrical consumption to said category of appliances; then during the filtering per se
(Continued)

of the digitalized demand curve, the filtering algorithms for each category of appliance are used successively to identify and regroup the power variation cycles consumed by said electrical appliances, from the digitalized demand curve.

20 Claims, 6 Drawing Sheets

(51) Int. Cl.
*G01R 21/133* (2006.01)
*G06Q 50/06* (2012.01)
*H02J 3/00* (2006.01)

(52) U.S. Cl.
CPC ...... *G01R 21/1331* (2013.01); *G01R 21/1336* (2013.01); *G01R 21/1338* (2013.01); *G06Q 50/06* (2013.01); *H02J 2003/003* (2013.01); *Y02B 70/3225* (2013.01); *Y04S 20/222* (2013.01)

(56) References Cited

OTHER PUBLICATIONS

Roos, "Non-intrusive load monitoring of electrical appliances", Elektron, Apr. 1994, pp. 27-29.
Hart, "Nonintrusive Appliance Load Monitoring", IEEE, Dec. 1992, pp. 1870-1891, No. 12.

\* cited by examiner

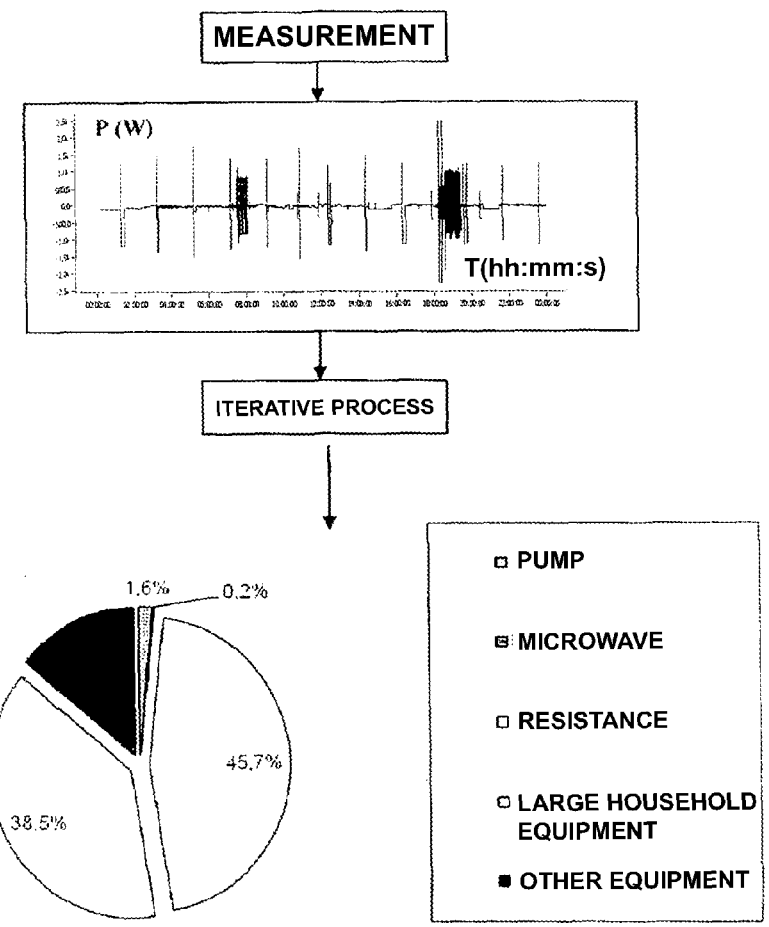
FIGURE 1
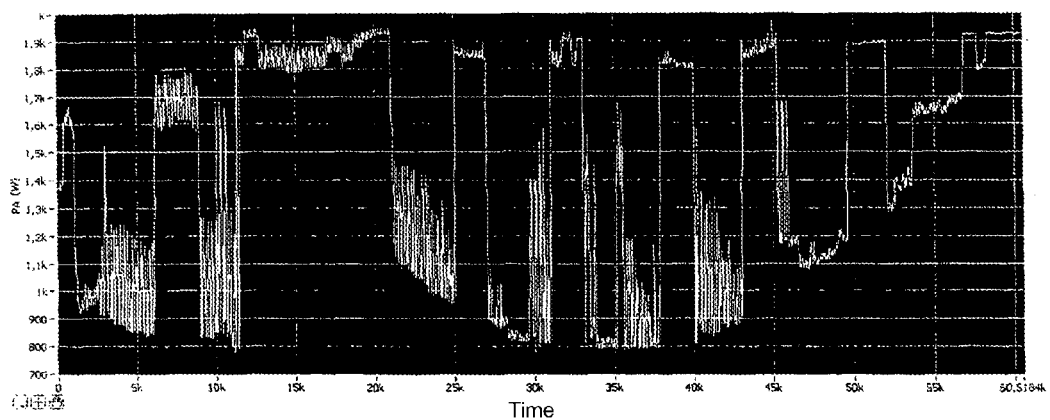
Figure 2: load curve extract saved in real time over a period of approximately sixteen hours.

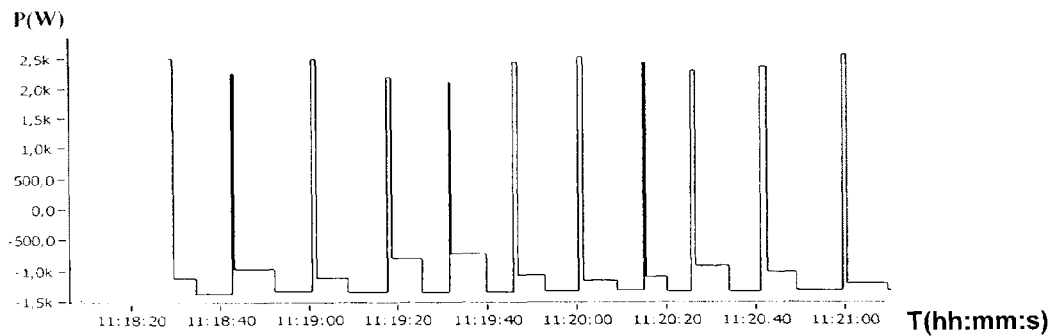
FIG.3A: "Pump" class
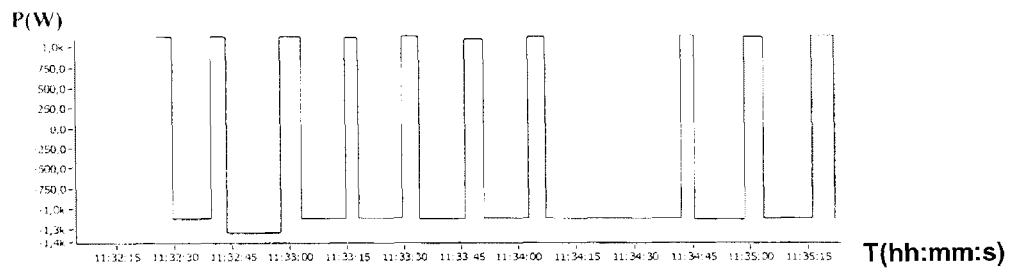
FIG.3B: "Resistance" class
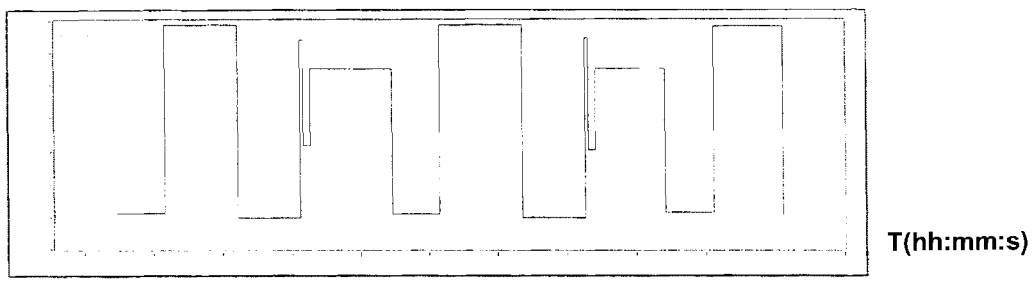
FIG.3C: "Microwave" class
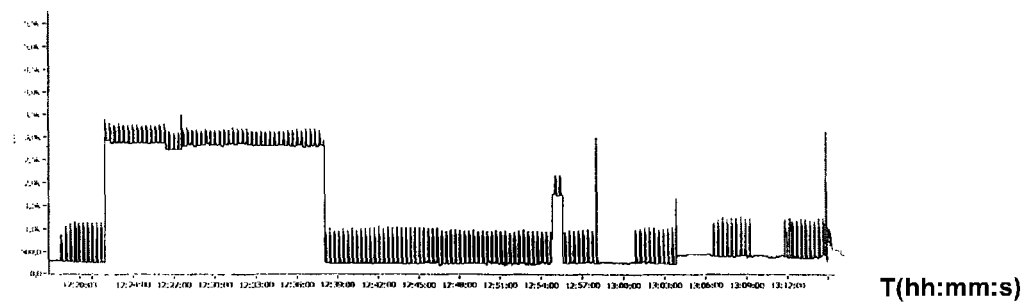
FIG.3D: "Large Household Equipment" class

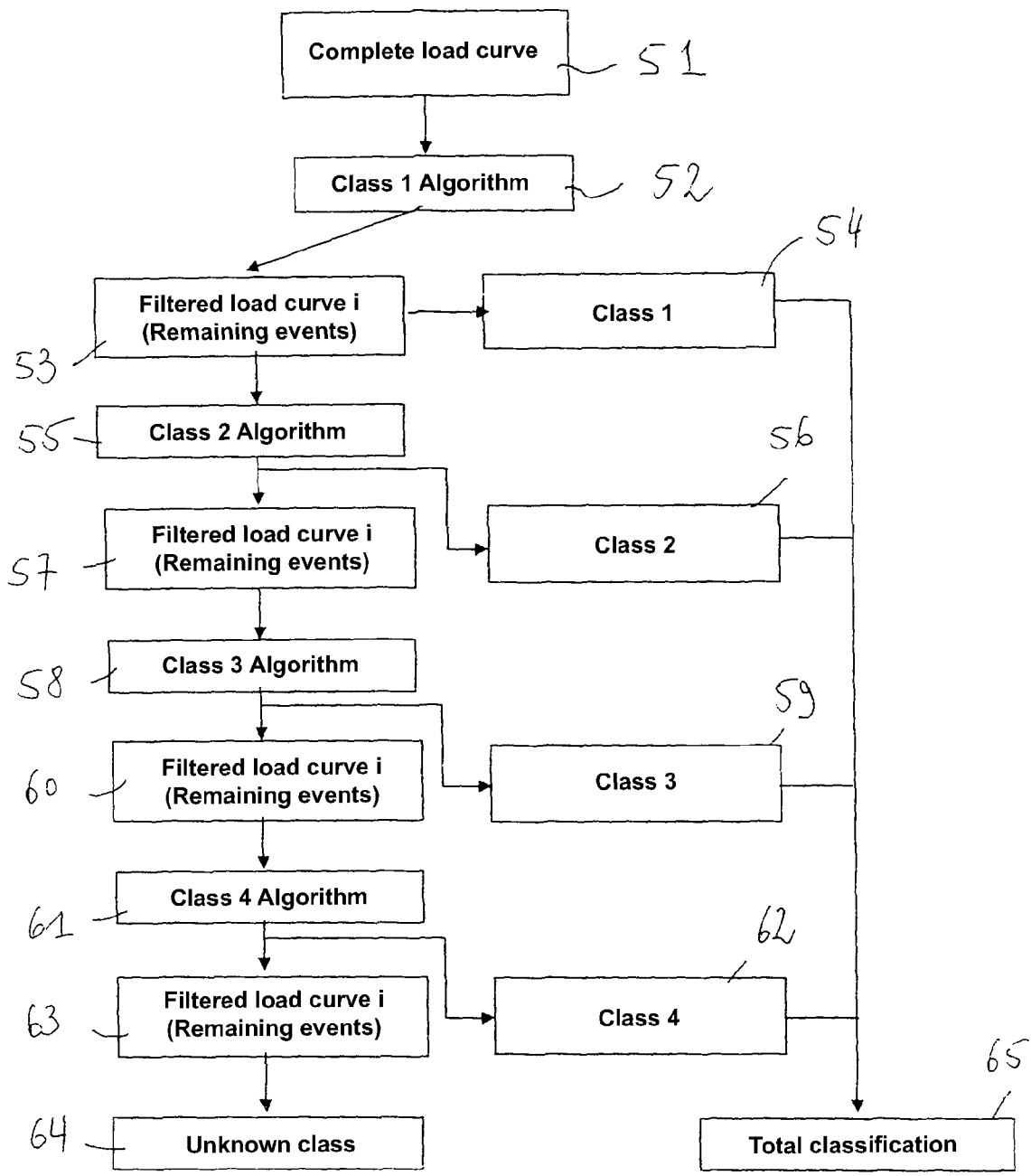
FIGURE 5.1

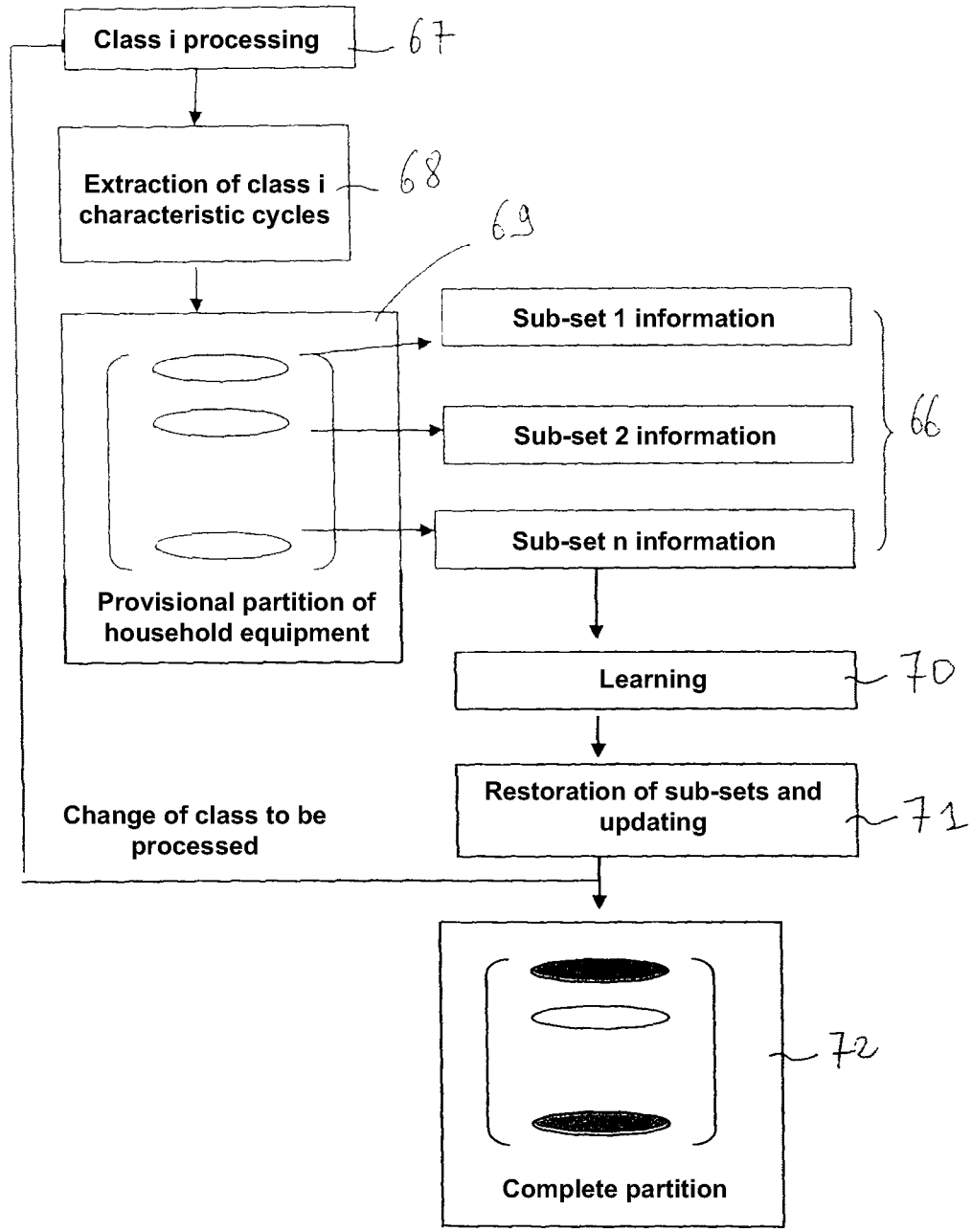
FIGURE 5.2

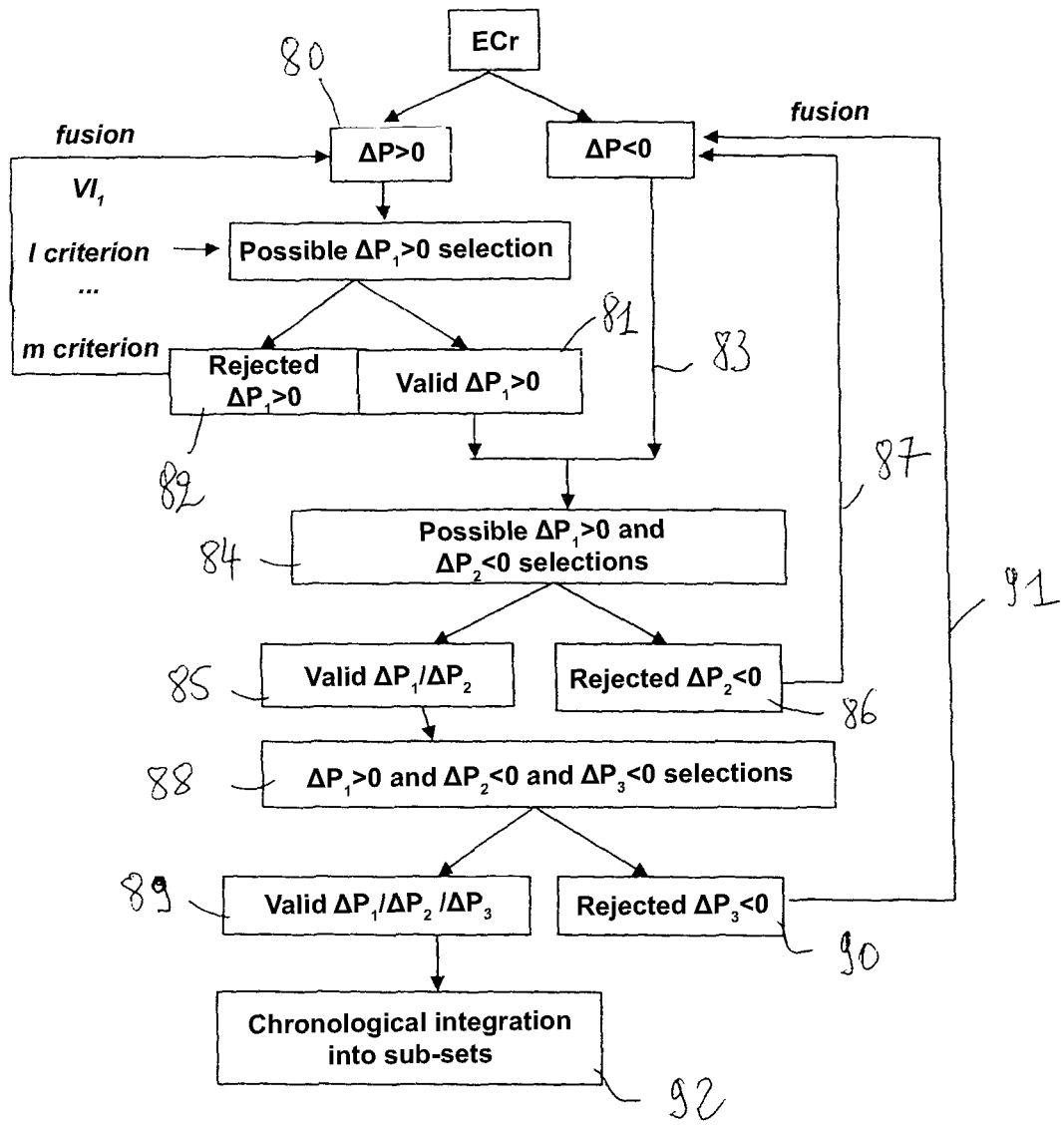
FIGURE 5.3

METHOD AND DEVICE FOR FILTERING ELECTRICAL CONSUMPTION CURVES AND ALLOCATING CONSUMPTION TO CLASSES OF APPLIANCES

The present invention generally relates to a method for filtering electric power consumption curves, more particularly in a residential surrounding, so as to be able to allocate the electric consumption of a consumption site to such or such class of electric household equipment. The aim of the implementation of the method according to the invention consists in being able to allocate the electric consumption of a site to such or such category of household equipment, so as to be able to follow and potentially reduce the consumption of each category of electric household equipment.

Accordingly, the invention finds a particular application in the field of the control of electric power consumption by individuals and/or companies. As a matter of fact, reducing the electric power consumption on a consumption site could first involve a better allocation of the daily consumption to the various pieces of household equipment used on this site.

STATE OF THE ART

Multiple techniques are already known to follow the electric consumption of a site, and to allocate parts of such electric consumption to such or such piece of household equipment.

According to one of such techniques, each piece of electric household equipment is provided with a wattmeter which measures the consumed electric power. The electric consumption by piece of household equipment or by group of household equipment can thus be determined. However, this method is expensive because of the additional equipment used as well as the required installation and setting of the consumed power measuring equipment with a greater detail than the one aggregated by the electric meter connected between the supply network and the consumption site.

According to another technique, described in patent EP 1 136 829 B1, the turning on and off of a piece of electric household equipment, through a high frequency signal emitted upon the turning on and off of a piece of household equipment, said high frequency signal being a kind of electric signature of the discussed piece of household equipment. Instant powers are recorded for each piece of household equipment. A data base is created: for each piece of household equipment, it contains various power values and various transient signals.

Recognition of the household equipment on the load curves, then the calculation of the power consumed is made by comparing the data base and the recorded load curves. But this assumes that the site owner or a technician will become familiar with the electric household equipment, i.e. keep a record of the site household equipment, and update it according to the additions and/or the displacements of the household equipment.

Known methods for determining the consumption of household equipment in an electric installation thus share an intrusive characteristic with respect to the site on which electric consumption will be analysed. As a matter of fact, the precise identification of the household equipment electric existing at individuals' is impossible without resorting to the information collected beforehand about the household equipment existing on the site. However, this learning phase makes the user feel uncomfortable and does not allow any change in consumption habits. In addition, several studies of signatures of electric household equipment have been carried out since 1990, but none could identify the electric household equipment without resorting to some kind of intrusion, whether during a manual learning phase, or during the creation of a reference base with the user, or during the subsequent monitoring of purchases or connections of electric equipment made by the user.

In spite of an a priori knowledge, through intrusive methods, of the detailed electric installations, known methods at best make it possible to report about 80% of the peak electric consumption, and often much less than 80% on an average.

AIMS OF THE INVENTION

The general aim of the invention is to provide a method for analysing the load curve of an electric installation, and a device implementing said method, which can remedy the drawbacks of the methods and systems known in the state of the art.

A particular aim of the invention is to provide a method able to extract then separate the consumption of the electric household equipment operating in an installation, without any kind of intrusion, simply from the analysis and the processing of the daily load curves.

Another aim of the invention is to provide a method for analysing or filtering an electric load curve, making it possible to allocate over 85%, on an average, of the electric consumption to well identified categories of household equipment, and in any way, over 70% of the consumption at every moment, in spite of the absence of a manual learning phase of the electric household equipment on the site, or the absence of an a priori knowledge of the details of the electric installation and of the household equipment connected thereto.

Another aim of the invention is to provide a very economical method and a device for analysing the consumption which requires no additional installation except for a simple box for the acquisition of the load curve close to the electric counter, and for the processing of said load curve, either locally on the site, or remotely, in a centralised way.

OBJECT OF THE INVENTION

The principle of the invention lies in the capacity to extract and then separate the household equipment without any kind of intrusion, from global daily load curves. In order to carry out such an extraction, ii is necessary to define, first, an innovating classification of the household equipment, from cycles of consumption characteristic of the household equipment or of the types of household equipment.

Then an automatic learning phase makes it possible to separate and to create a relative partition of the household equipment employed by the user. Such a partition makes it possible to collect (active, reactive, apparent) power information, as regards time, voltage, intensity, impedance or any other one, making it possible to restore most of the cycles produced by one piece of household equipment in operation. Such a restoration phase is unique since it is based on a hierarchical principle of selection of possible power combinations. Criterion and thresholds specific to each class of household equipment are estimated, thus making it possible to take into account the specific power of the household equipment.

Eventually, the method imparts a sequence of presentation of the filtering algorithms of the load curve, in order to substantially reduce mistakes in the allocation of cycles.

In order to reach the desired aims, the object of the invention is more particularly a method for analysing the electric consumption of a plurality of electric household equipment operated on a consumption site, by filtering a load curve representing the electric consumption of said household equipment as a function of time, characterised in that it comprises the following steps:

prior to the filtering proper of the load curve:
  save and digitize the load curve, so as to obtain a digitized load curve by periods of time;
  define a set of classes of household equipment, with each class being defined by similar power variation cycles as a function of time;
  define for each class of household equipment, an algorithm for filtering the load curve dedicated to said class of household equipment, with said algorithm being able to extract power variation cycles from the digitized load curve, and to allocate it to said class of household equipment;
then, during the filtering proper of the digitized load curve, successively use the filtering algorithms dedicated (to each class of household equipment for identifying and grouping, from the digitized load curve, the variation cycles of the power consumed by the electric household equipment.

According to one aspect of the invention, the step of filtering the digitized load curve for one given class of household equipment includes the following operations:
search for, and extraction from the load curve of the power variation cycles characteristic of a given class of household equipment;
validation of the extracted cycles as a function of predefined power and time criteria, and distribution of the extracted cycles between a set of valid cycles corresponding to the power and time operation model of a piece of household equipment, and a set of provisionally rejected de cycles;
creation of a provisional partition composed of incomplete sub-sets of power variation valid cycles, with each incomplete sub-set including cycles of only one piece of household equipment;
local learning of the valid cycles of each provisional partition, so as to define power and time criteria characteristic of the valid cycles;
from the power and time criteria resulting from the local learning, restoration of the complete or quasi-complete chronological model of operation of each piece of household equipment, by allocating it previously provisionally rejected power variation cycles;
updating the classification and the learning according to the step of restoration, so as to create a final partition of the extracted cycles, with each partition corresponding to the consumption of a piece of household equipment.

The step of search for and extraction of the power variation cycles characteristic of a given class of household equipment, consists in defining characteristic binary codes corresponding to the power variations of such class of household equipment, then in subtracting from the digitized load curve, the thus defined characteristic binary codes and in classifying these either in a set of valid cycles corresponding to the model of operation of a piece of household equipment, or in a set of provisionally rejected cycles, then in re-injecting the provisionally rejected cycles into the load curve prior to searching for the power variation cycles relative to another class of household equipment.

According to the invention, in order to validate the extracted cycles for a given class of household equipment, the power and time characteristics of the extracted cycles are compared with the power and time criteria predefined for this class, and those of the cycles which have power and time characteristics incompatible with the fixed criteria are provisionally rejected, the other cycles are definitively validated as belonging to a piece of household equipment of a given class.

The creation of a provisional partition composed of incomplete sub-sets of valid power variation cycles for each piece of household equipment includes steps consisting in grouping the valid power variation cycles having substantially the same values for the power and time criteria, so that each group of cycles represents the cycles of a piece of household equipment of the class having been operated on the load curve, then in representing the provisional partition as a matrix of information where each line represents one piece of household equipment and each column contains the valid extracted cycles belonging to the household equipment.

The step of learning consists in calculating the values of a set of power and time criteria associated with the valid cycles of each piece of household equipment, then in making a statistical analysis of these values, and in storing the obtained statistics in a memory, as an information vector associated with each piece of household equipment.

The step of restoration consists in restoring, for each piece of household equipment, the complete or quasi-complete set of the power variation cycles for this piece of household equipment between the turning on and off thereof, by chronologically integrating in the set of the valid cycles of such piece of household equipment, cycles selected from the set of provisionally rejected cycles, with such selection being made using criteria and thresholds resulting from the learning step.

The step of creating a final partition consists in updating each sub-set of cycles representing a piece of household equipment of the filtered class, with the missing cycles as restored during the step of restoration. Upon completion of the updating, the part of the consumption of the class corresponding to such a piece of household equipment is obtained and the remaining, not allocated power variations are re-injected into the remaining load curve.

Advantageously, the power and time criteria are self-adapting and vary from one load curve to another. This makes it possible to increase the efficiency of the method for analysing the successive load curves.

Preferably, the method according to the invention includes a step consisting in aggregating the electric consumptions of each class of household equipment from the final partition of the extracted cycles, so as to produce a summary report indicating the electric consumption, or the proportion of electric consumption, of the household equipment of each class during a consumption analysis period.

In order to have enough power variation data available, the load curve is digitized by periods of time equal to or under one second.

In an advantageous practical embodiment, the set of predefined classes of household equipment includes at least one of the classes among the following ones:
the so-called class of electric pumps;
the so-called class of electric resistances;
the so-called class of microwave ovens;
the so-called class of large electric household equipment;
the class of the other electric household equipment which is not concerned by one preceding class.

The so-called class of electric pumps is defined by a power consumption variation cycle successively including a first positive power variation, a second negative power variation, and a third negative power variation.

The so-called class of large electric household equipment is defined by a power consumption variation cycle successively including at least four power variations, i.e. a first positive power variation, a second negative power variation, a third positive power variation, and a fourth negative power variation.

The so-called class of microwave ovens is defined by four types of distinct power variation cycles, with the first type of cycle comprising a positive power variation followed by a negative variation, with the second type of cycle comprising two positive variations followed by a negative variation, with the third type of cycle comprising a positive variation followed by two negative variations, and the fourth type of cycle comprising two successions, each composed of a positive variation followed by a negative variation.

The so-called class of electric resistances is defined by a power consumption variation cycle successively comprising a first positive power variation followed by a second negative power variation.

Preferably, the digitized load curve is successively filtered using a specific algorithm for each class of household equipment, and the succession of said algorithms is sequenced. Then, the filtering method preferably successively implements the filtering algorithm relative to the class of pumps, then the filtering algorithm relative to the class of microwave ovens, then the filtering algorithm relative to the class of large electric household equipment, then the filtering algorithm relative to the class of resistances. This sequence makes it possible to minimize the number of cycles incorrectly allocated to one piece of household equipment, and consequently to increase the performances of the filtering method.

The method according to the invention can be integrally implemented on the consumption site or partially on the consumption site and partially on a remote processing site. Then in an alternative embodiment of the method, the step of acquisition of the load curve is carried out locally, and the digitized values representing the load curve are then processed locally in a processing box provided on the consumption site.

According to another variant of the method, the step of acquisition of the load curve is carried out locally, and the binary values representing the load curve are then transmitted to a remote processing centre where the steps of filtering the load curve are carried out.

Another object of the invention is also a processing device intended to be connected to the electric power line of a consumption site, characterised in that it includes software able to implement the filtering method according to the invention.

The invention will be better understood when referring to the drawings, wherein:

FIG. 1 shows a schematic diagram of the inputs and outputs of the method according to the invention;

FIG. 2 shows a possible extract of the load curve which can be saved in real time and used as an input of the method.

FIGS. 3A to 3D show typical signatures of household equipment for 4 classes extracted from the load curves;

Figure 4:
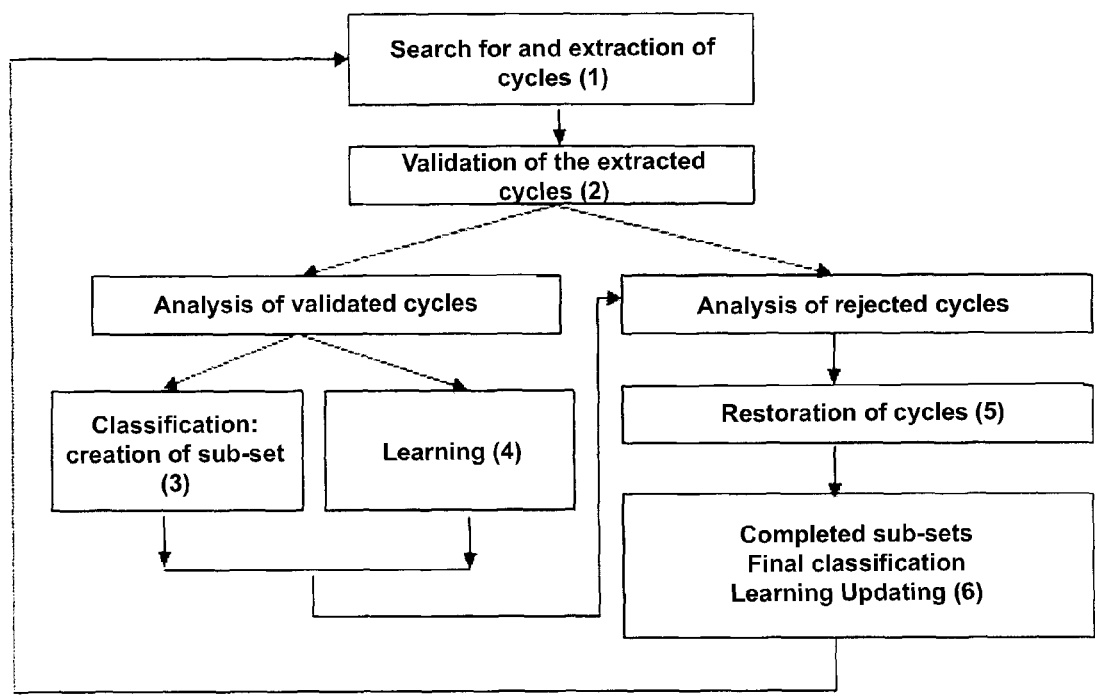
FIG. 4 shows a schematic flowchart of the global filtering algorithm according to the invention.

FIG. 5.1 shows a more detailed flowchart of the algorithm filtering the load curve and restoring the classes of household equipment;

FIG. 5.2 shows a principle flowchart of the filtering algorithm for a class of electric household equipment;

FIG. 5.3 shows an exemplary flowchart for the phase of restoration of consumption cycles of the diagram of FIG. 5.2;

DETAILED DESCRIPTION OF THE INVENTION

Reference is made to FIG. 1. Globally, it is possible to describe the method according to the invention as a function of the inputs to be supplied, and of the outputs to be issued.

As an input of the method, a measurement of the electric power consumed on a site of consumption is available. Such measurement is more particularly shown on a graph by an analog load curve showing the consumed power, as a function of time, as shown in FIG. 1 during some period of analysis.

The load curve is subject to an iterative process, the aim of which is to distribute the global consumption of the site between several categories or classes of household equipment, without the nature of the electric household equipment operating on the site being a priori known. The distribution of the consumption is then given as a table, or else, as shown in FIG. 1, as a graph of sectors giving an instant visual indication of the consumption to be allocated to each class of household equipment.

The aim to be reached consists in obtaining a minimum rate of 70% of correct classification of the household equipment, and a rate of classification above 85% on an average. As mentioned herein under, it is impossible to allocate 100% of a global electric consumption to the various pieces of household equipment, because of various factors, but a significant rate of classification must be reached to provide the user a level of information sufficient to make the analysing device credible.

Measuring System

A measuring system (not shown) is used which can record all the electric variations occurring on the electric network at a consumer's, over a given period of time with one sampling every second. The system is provided with an intensity sensor which can be materialized by a hook-on ammeter and a voltage sensor materialized for example by a transformer (the value of which is known) connected to a socket of the network. Such variations are shown by a graph named « load curve ».

FIG. 2 shows in greater details an extract from a load curve showing the active power recorded over a period of sixteen hours.

The response in power and time variations of the electric household equipment will be studied from such load curves. In order to analyse such responses, a reference base containing so-called « learning » load curves has been created. Such curves contain the electric activity of the household equipment currently used by consumers, such as vacuum cleaners, fridges, microwaves, coffeemakers, ovens, irons, lamps, food processors, toasters, auxiliary heating systems, water heaters, washing machines, dishwashers, TV sets, etc.

Understanding the operation of the household equipment electric is founded on the recording of (active, reactive, apparent) power load curves. In order to obtain the load curves recorded over a certain length of time, the instant power supplied to the network must be measured and the elementary electric values must be recorded: signal RSM voltage, Ueff, in volts (V), RSM intensity, Ieff, in amperes (A), and power factor, $\cos(\phi)$.

An individual's electric network is supplied with an alternative current 50 Hz in frequency, for example, and the voltage of which is theoretically 220V for example in a series of countries. Of course, using different frequencies and voltages does not significantly change the measure of the consumed power.

Household equipment is mostly composed of electromagnetic receivers (coils, engines, etc.). Most receivers are not purely resistive, but they have either an inductive, or a capacitive behaviour. This implies a phase displacement between current and voltage. It is thus necessary to take into account the power factor (cos (φ)) determined by the phase angle φ, between the rated voltage and the rated current.

Other electric variables can be determined from these values. As is well known, two types of output powers are calculated for an alternative current:

the active power, noted P, expressed in watts (W), which corresponds to a supply of energy transmitted to receivers and convertible into heat or work. The active power is the most generally used one since it corresponds to the reality of the work or the heat supplied by the charge while taking into account the phase displacement between voltage and current. We have:

$$P = U_{eff} \cdot I_{eff} \cos(\phi)$$

the reactive power, Q, in reactive ampere volts (RAV) which corresponds to the artificial power which characterizes the exchange of energy not used for supplying work. We have:

$$Q = U_{eff} \cdot I_{eff} \sin(\phi)$$

Finally, electric impedance, Z, in Ohms (Ω), is calculated, which measures the opposition of an electric circuit when a sinusoidal alternative current passes. We have:

$$Z = \frac{U}{I}$$

Definition of the Household Equipment Classes as a Function of the Typical Mode of Consumption Thereof One aspect evidenced by experiments, and whereon the invention is based, is that the systematic analysis of multiple load curves for actual household equipment of a reference base gives very useful information on the consumption profile of each piece of household equipment.

Such an analysis then makes it possible to create an appropriate classification of several standard pieces of household equipment.

As a matter of fact, the study of the load curves of the reference base showed that it is possible to group certain electric household equipment according to classes. Such classes are defined according to an operation mode resulting from the internal components of the household equipment. A lot of electric household equipment has a similar power response, in spite of a very different utility (example: fridges and vacuum cleaners).

Electric household equipment contains various electric components and thus has various characteristic behaviours. When the active power variation on a load curve, between the turning on and off of one piece of household equipment is analysed, the repetition of sequenced «cycles» of active power variations can be observed. A power cycle can be defined by the succession of positive and negative active power variations. From this observation, four classes of electric household equipment currently used in households could be defined. Such classes are characterised by one or several typical power cycles.

Of course, the invention is not limited to the classification of the consumption of domestic electric household equipment, but the persons skilled in the art may extend it to other types of pieces of electric household equipment, more particularly in the industry, which will probably give rise to additional classifications.

The following terms, which will be used herein under, will be defined from this first study on the operation of household equipment:

Power Cycle: sequenced succession of positive or negative power variations at regular time intervals.

Operation Model: regular succession of power cycles produced by the piece of household equipment between the turning on and turning off thereof, on the electric network.

With reference to FIG. 3, the four classes of household equipment used within the scope of the present description will now be described in greater details.

FIG. 3A shows a load curve typical of the household equipment of the pump class. The «Pump» class characterizes the household equipment having a compressive type operation. When such piece of household equipment is operated, it produces a regular cycle defined by a positive power variation (indicated $\Delta P_1 > 0$) and two negative power variations (indicated $\Delta P_2 < 0$, $\Delta P_3 < 0$). In this class are classified pieces of household equipment such as fridges, vacuum cleaners, all types of pumps, etc.

FIG. 3B shows a load curve typical of electric resistances. The «Resistance» class characterizes household equipment equipped with a resistance or a universal motor. Such household equipment generates a power cycle defined by a positive power variation (indicated $\Delta P_1 > 0$) followed by a negative power variation ($\Delta P_2 < 0$). In a residential surrounding, pieces of household equipment such as ovens, coffeemakers, kettles, convectors, the water heaters, lamps, etc. are classified in this class.

FIG. 3C shows a load curve typical of microwave ovens. Microwave ovens are pieces of household equipment classified separately in a so-called «Microwave» class since the power response thereof is defined by four distinct power cycles making it possible to separate it from the other pieces of household equipment.

The first type of power cycle is composed of two power variations:

a first positive power variation: $\Delta P_1 > 0$,
a second negative power variation: $\Delta P_2 < 0$.

A microwave oven may generate cycles corresponding to the cycle model of the «Resistance» class, i.e. two power variations. However, the time intervals between the various cycles are not as regular as in the case of the cycles generated by resistive household equipment. This type of cycle constitutes the first category of variations generated by the microwave oven.

The second type of cycle for the «Microwave» class is composed of three power variations:
a first positive power variation: $\Delta P_1 > 0$
a second positive power variation: $\Delta P_2 < 0$
a third negative power variation: $\Delta P_3 < 0$ The third type of cycle for the «Microwave» class is composed of three power variations:
a first positive power variation: $\Delta P_1 > 0$
a second negative power variation: $\Delta P_2 > 0$
a third negative power variation: $\Delta P_3 < 0$ As can be seen, this cycle corresponds to the cycle model of the «Pump» class. However, the time intervals between the power variations cannot be compared to those generated by the compressive household equipment.

The fourth cycle for the «Microwave» class is composed of four successive power variations:
a first positive power variation: $\Delta P_1 > 0$
a second negative power variation: $\Delta P_2 < 0$
a third positive power variation: $\Delta P_3 > 0$
a fourth negative power variation: $\Delta P_4 < 0$ Microwave ovens are the only pieces of electric household equipment to be defined by four possible power cycles. It has been observed that, in operation, microwave ovens do not produce only one of the four possible cycles. Several types of cycles can alternate within a few minutes. This alternation of power cycles, different over time, makes it possible to discriminate this piece of household equipment with respect to household equipment of the other classes.

Finally, pieces of household equipment such as: washing machines, dishwashers, dryers are grouped within the «Large Household Equipment» class.

They can easily be identified on a load curve such as the one shown in FIG. 3D, since this household equipment generates a very large number of cycles and the operation of which generally extends over a very long period of time (from 30 minutes minimum up to 2 h30 on an average). The power cycle generated by this type of piece of household equipment is in most cases composed of four successive power variations. However, some household equipment of this type can have cycles composed of more than four power variations. Up to ten successive variations could be counted during the experiments. The variations always are an even number and the interval between the different variations is of the order of one second. The power variations composing the cycles thus are:
a first positive variation: $\Delta P_1 > 0$
a second negative variation: $\Delta P_2 < 0$
a third positive variation: $\Delta P_3 > 0$
a fourth negative variation: $\Delta P_4 < 0$
etc.

Most of the domestic electric household equipment are to be classified in the four large classes defined hereunder. Within the same class, time and power characteristics of these cycles vary according to the operated piece of household equipment.

However, some household equipment the power response of which cannot be easily defined will not belong to these four classes. Therefore a so-called «Other household equipment» class will be added to the classification, which will report all the not allocated power variations, it being understood that the aim is to minimise the fraction of the total consumption which should be put in this class.

Principle of the Global Method for Filtering the Load Curves

As the load curve is assumed to be obtained by measurements, and the classes of household equipment are defined by the power cycles thereof, the processing which is applied to the load curve will now be described in its entirety, while referring to FIG. 4.

We start from the principle that the analog load curve P=f(t) is first digitally coded, for example by conventionally associating each positive power variation with the value «1», and by associating each negative power variation, with the value «0». Of course, other codifications could be possible, without affecting the general characteristic of the invention.

The global filtering process of the load curve operates with a series of main steps referenced 1 to 6 in FIG. 4, which shall be described in greater details hereunder, and which are shared by all classes. However the distribution of the household equipment between the classes is important since each class is filtered with a specific algorithm.

For each class, the load curve is filtered to extract the consumption of the household equipment corresponding to said class. The extraction relies on the search for characteristic power variation cycles which made it possible to define the class.

Thus, for example, in order to search in the load curve for the power variation cycles created by the household equipment of the pump type, all the «100» codes are identified in the digitized load curve, and they are subtracted from the load curve. Upon completion of this step of extraction, the algorithm separates the cycles which can easily be distinguished from the problematic ones and which need a second level of analysis before being affected to one class of household equipment.

As a matter of fact, a «100» cycle may have been generated by a piece of household equipment of the «Pumps» class or by other pieces of household equipment, but the superimposition of the power variation cycles of which also gives a «100» code. In order to discriminate the actual «100» cycles caused by pumps, an additional characterisation based on power criteria relative to power variations and occurring time criteria of such power variations in the cycle is associated with the characterisation of the pumps class by the «100» code. Such power and time criteria are fixed beforehand based on the prior analysis of a plurality of pieces of household equipment, and the fixed power and time criteria are invariants for each class of household equipment.

For example, in the case of current fridges, which belong to the pumps class, it has been established that the first power variation $\Delta P_1$ varies within an interval of the order of 100 watts about the average power variation $\Delta P_1$ of all the domestic fridges on the market.

Consequently, we can say that the detection of a «100» code corresponding to a first power variation outside the above mentioned interval, would enable us to conclude that the discussed piece of household equipment is not a fridge, and consequently to reject the corresponding «100» code as invalid.

It results therefrom that the extraction step of the cycles also makes it possible to form a first partition of household equipment within the analysed class. Each piece of household equipment in a class is defined by a sub-set of cycles containing a certain number of cycles produced between the turning on and off thereof.

The class algorithm executes a learning phase from these cycles and for each sub-set. This is a synthesis of statistical information relative to the consumption of the household equipment, and such statistical information is then grouped in information vectors, as explained in greater details herein under.

The collection of such statistical information represents the core of the algorithm operation since it is the only means to define and then to separate the pieces of household equipment within the same class.

As a matter of fact, the cycles sub-sets are very seldom complete, i.e. the algorithm first rejected a certain number of cycles produced by the household equipment of the class since they did not first correspond with the power and time criteria fixed for the class. Such reject more particularly occurs in the case where several pieces of household equipment were operating at the same time and the power cycles of which got mixed.

The integration and the reconstruction of all the cycles generated by one piece of household equipment, between the turning on and off thereof, is consequently executed by a so-called restoration phase. This phase collects the data obtained during the learning and restores the missing power variation cycles for each partition sub-set. After the phase of restoration, it is possible to calculate the power consumed by each piece of household equipment, and consequently the consumption of all the household equipment in this class.

The same is true for the other classes, and for the remaining consumption of the load curve, which corresponds to the « Other» category, i.e. all the consumption which could not be allocated to one of the predefined classes of household equipment.

From the consumption of each class of household equipment, it is easy to calculate the percentage of this consumption with respect to the comprehensive consumption corresponding to the load curve during the period of analysis. Of course, the respective consumption of the various classes of household equipment and of the « Other» class can then simply be represented as a table or as a graph (see FIG. 1) for the client in charge of the consumption site.

Global Filtering of the Load Curve (FIG. 5.1)

The global filtering method generally described above is illustrated in greater details in FIG. 5.1, which shows the main steps of the global filtering method of the load curve:

The first step, noted 51, consists in loading and in reading the complete load curve as recorded and coded as a succession of « 1» and of « 0».

Then, in a second step, noted 52, the first filtering algorithm, corresponding to class 1, is applied to the whole load curve. Insofar as the first algorithm corresponds to that of the pumps class, this is equivalent to searching for all the « 100» codes in the complete load curve, to subtracting these from the load curve for extraction, and putting these, in 54, in a first class noted class 1.

Upon completion of the filtering of the load curve by the first algorithm, the algorithm 2 is applied in 55 to the residual load curve 53 already filtered by the algorithm 1, i.e. the load curve minus the cycles corresponding to the class 1. The filtering by the algorithm 2 results in the search for the digital codes corresponding to the second class of household equipment in the residual load curve. In 56 such codes are put into class 2, and a new residual load curve is obtained in 57, from which all the codes corresponding to the power variations of the household equipment of the second class have been subtracted.

Then the same method is similarly applied (steps 58 to 63) to the codes of the remaining classes, i.e. classes 3 and 4 if the classification is executed on four classes of household equipment.

Upon completion of this iterative process, a classification as complete as possible at this stage is obtained in 65, i.e. all the codes corresponding to the various classes have been extracted from the load curve, and the remaining codes in the load curve correspond to an unknown or « other» class, noted 64, which correspond either to power variations cycles of household equipment which cannot be classified in predefined classes, or cycles of household equipment of classes 1 to 4, but which could not be recognized as such at this stage, and which will require an additional processing.

Description of the Local Filtering Algorithms for Each Class of Household Equipment (FIG. 5.2)

Each algorithm specific to one class of household equipment must execute the following functions:
extract from the load curve the power variation cycles of the concerned class, based on the recognition of a code characteristic of the class discussed, as described here above;
analyse the validity of the cycles extracted from the load curve: in fact, some extracted cycles may actually correspond to the superimposition of power variation cycles of several pieces of household equipment. Such cycles must be identified as invalid and re-injected into the load curve for the rest of the processing operations;
separate the power variation cycles of two pieces of household equipment simultaneously operating;
chronologically restore a model of complete operation of each piece of household equipment;
partition the household equipment within the same class.

FIG. 5.2 represents in greater details the flowchart of the filtering algorithm of the load curve for each class of household equipment. This diagram includes the following main steps, each one of which shall be described in greater details herein under:
in 68, search for and extraction of the power variation cycles of a given class 67, noted class I;
validation (not shown in this Figure) of the extracted cycles, so as to make sure that the extracted cycles correspond to the discussed class i;
in 69, creation, inside said class i, of a first classification composed of cycles sub-sets belonging to the same piece of household equipment, which results in a provisional partition of the household equipment;
in 70, local learning of the cycles corresponding to each piece of household equipment, from power and time information, in 66, relative to the cycles, for refining the power and time criteria of the given class;
based on this learning, restoration, in 71, of the missing cycles, for completing the chronological model of operation of each piece of household equipment;
updating the classification and the learning, and creation, in 72, of a final partition of household equipment in the given class i.

Each one of the steps will now be described in greater details.

Step 1 (FIG. 4): Search for and Extraction of the Cycles.

The table herein under summarizes the power cycles of each class and the associated binary code thereof, on the basis of which the cycles are searched.

TABLE binary code associated with the power cycles for each class

| Class | Cycle | Associated Binary Code |
|---|---|---|
| Pump | $\Delta P_1 > 0, \Delta P_2 < 0, \Delta P_3 < 0$ | 100 |
| Resistance | $\Delta P_1 > 0, \Delta P_2 < 0$ | 10 |
| Microwave | $\Delta P_1 > 0, \Delta P_2 < 0$ | 10 |
|  | $\Delta P_1 > 0, \Delta P_2 > 0, \Delta P_3 < 0$ | 110 |
|  | $\Delta P_1 > 0, \Delta P_2 < 0, \Delta P_3 < 0$ | 100 |
|  | $\Delta P_1 > 0, \Delta P_2 < 0, \Delta P_3 > 0, \Delta P_4 < 0$ | 1010 |
| Large household equipment | $\Delta P_1 > 0, \Delta P_2 < 0, \ldots, \Delta P_{i-1} > 0, \Delta P_i < 0$ i allant de 1 à K (pair) | 1010, . . . , 0 |

The algorithm reads the coded load curve with a binary code for filtering the cycles corresponding to the studied class i. For filtering the cycles, binary codes to be searched for in the load curve are defined. A cycle is composed of several power variations, defined by the following code:

$$\begin{cases} 1 & si \Delta Pi > 0 \\ 0 & si\ non \end{cases}$$

A load curve results in the power variations being grouped in a table noted CC. Thus, for the load curve, a table containing for example the following binary values is obtained:

$$CC=\{1,0,0,1,0,1,0, \ldots ,0\}$$

The class i algorithm searches for, and extracts from table CC the codes corresponding to class i as summarized in the table herein under.

Experiments surprisingly revealed that, in order to optimise the filtering process of the load curve and avoid most allocation errors in the classes, a preferred order should be imposed for the filtering corresponding to the various classes, i.e. filtering the cycles of the classes in a sequence.

The ideal presentation order aimed at must make it possible to more easily filter:
the cycles which can be easily extracted from the load curve since they are very regular (this is the case of the household equipment of the « pumps» type),
the cycles produced for a very short time (microwave).

Finally, it can be seen that the best order for implementing the algorithms for filtering a load curve is:
(1) the « Pumps» algorithm
(2) the « Microwave» algorithm
(3) the « Large Household Equipment» algorithm
(4) the « Resistances» algorithm Step 2 (FIG. 4): Validation of the Extracted Cycles.

Upon completion of the process of binary codes extraction, the algorithm analyses the cycles, in order to validate or reject them on the basis of one invariant criterion of the class. The invariant criteria used are power and time criteria associated with the cycles. The power and time characteristics of the cycles are thus compared to the predefined power and time criteria.

As a matter of fact, the power variations observed for a cycle have values which can be compared to the values expected for one class of household equipment or for one piece of household equipment. The validation of one cycle is then carried out with a criterion defined as a combination of power associated with all the power variations of the cycles, more particularly the value of the first power variation of the cycle.

Besides, a certain amount of time noted $\Delta T$ passes by, between the various power variations of one cycle, and this time can also be compared to time criteria predefined for each class of household equipment.

A first analysis is then executed on the cycles extracted from the load curve in order to certify, first, that these cycles actually correspond to the household equipment of the concerned class, and in order to reject the cycles incompatible with the fixed power and time criteria, among which the algorithm cannot, consequently, make a precise selection.

Consequently, one cycle valid for one piece of household equipment is a cycle presenting the correct succession of power variations (i.e. the correct code), and the power and time characteristics expected for this piece of household equipment.

Most often, the rejects of cycles result from two pieces of household equipment being operated simultaneously, and the cycles of which got mixed, so that they have to be analysed in greater details.

As a function of this analysis based on fixed criteria, two sets are then created:
that of the validated cycles, noted ECv;
that of the provisionally rejected cycles, noted ECr;

During the execution of the four filtering algorithms corresponding to the four classes of household equipment, we first have four ECv sets, of valid but incomplete cycles. As a matter of fact, cycles are missing in the operation of each piece of household equipment because of the provisionally rejected cycles. Each ECv set is then completed by an updating, upon completion of a filtering algorithm, before executing the next algorithm.

Step 3 (FIG. 4): Creation of the First Provisional Classification of the Household Equipment One first statistical analysis of the power variations composing the validated cycles makes it possible to create a partition of the cycles allocated to one class of household equipment, where each sub-set represents the cycles of one piece of household equipment of the class having been operated on the load curve.

As explained hereunder, this classification of the cycles will then make it possible to execute learning on the cycles, and to count the number of household equipment belonging to the class, then to draft the complete operation model of each piece of household equipment.

The results are given as an information matrix where each line represents one piece of household equipment (or sub-set noted $SS_i$) and each column contains the valid extracted cycles belonging to the piece of household equipment.

Step 4 (FIG. 4): Local Learning of the Cycles

After the steps of research, validation and classification of the cycles, step 4 represents the second part of the algorithm execution, and constitutes an essential step of the classification of the household equipment. The information obtained upon completion of this step enables the algorithm to estimate the power variations to be taken into account for restoring the complete operation model of one piece of electric household equipment.

As the cycles have been provisionally rejected for one piece of household equipment, it is not possible yet to determine the electric consumption for this piece of household equipment. In step 4 of learning, followed by step 5 of restoration of the cycles, the consumption of each piece of household equipment must be refined within its class. Therefor, it is necessary to collect the power variation cycles missing in the operation model of this piece of household equipment.

Before collecting the missing cycles, it is necessary to define new values of operating criteria, closer to the actual operation of the household equipment, substituting the values of the previously fixed power and time criteria which made is possible to build the ECv and ECr sets.

In order to define new criteria and the corresponding values, the various power and time characteristics of the observed cycles are statistically analyzed.

The tables hereunder give an example of the various criteria which can be calculated and statistically analysed for each algorithm corresponding to the considered four classes.

TABLE 1 list of the criteria to be analysed for the pumps and the resistances

| Criterion | Pumps | Resistances |
|---|---|---|
| Power Variation | $\Delta P_1 = P_1 - 0$<br>$\Delta P_2 = P_1 - P_2$<br>$\Delta P_2 = P_2 - P_2$ | $\Delta P_1 = P_1 - 0$<br>$\Delta P_2 = P_1 - P_2$ |

$$\Delta PT = \sum_{i=1}^{Z} Pi$$

TABLE 1-continued list of the criteria to be analysed for
the pumps and the resistances

| Criterion | Pumps | Resistances |
|---|---|---|
| Time Variation | $\Delta T_1 = T(P_2) - T(P_1)$<br>$\Delta T_2 = T(P_2) - T(P_2)$<br>$\Delta T_3 = T(P_2) - T(P_1)$<br>$\Delta T_4 = T(P_1) - T(P'_1)$ | $\Delta T_1 = T(P_2) - T(P_1)$<br>$\Delta T_4 = T(P_1) - T(P'_1)$ |

TABLE 2 list of the criteria to be analysed for
the microwave and for the large household equipment

| Criterion | Microwave | Large household equipment |
|---|---|---|
| Power Variation | $\Delta P_1 = P_1 - 0$<br>$\Delta P_2 = P_1 - P_2$<br>$\Delta P_3 = P_3 - P_2$<br>$\Delta P_4 = P_4 - P_2$<br>$\Delta PT = \sum_{i=1}^{Z} Pi$ | $\Delta P_k = P_{k+1} - P_k$<br>$\Delta PT = \sum_{i=1}^{k} Pi$ |
| Time Variation | $\Delta T_1 = T(P_2) - T(P_1)$<br>$\Delta T_2 = T(P_2) - T(P_2)$<br>$\Delta T_3 = T(P_2) - T(P_1)$<br>$\Delta T_4 = T(P_1) - T(P'_1)$<br>$\Delta T_5 = T(P_4) - T(P_3)$ | $\Delta T_k = T(P_{k+1}) - T(P_k)$<br>$\Delta T_4 = T(P_1) - T(P'_1)$<br>Duration of the heating phase<br>Duration of the tumble phase<br>Duration of spin drying |

For each power and time criterion defined in each class, the algorithm will analyse the cycles with the following statistic tools: average, median, variance, maximum, minimum.

The results of such calculations are stored in the memory, for each sub-set of cycles corresponding to one piece of household equipment, in a vector called « information vector », and noted $VI_{i=1, \ldots, F}$ with F representing the dimension of the partition. Such vectors are the only source of information for the algorithm on the household equipment resulting from the load curve, and replace any manual acquisition of information on the household equipment, for example by the owner of the consumption site or a technician. The method is thus not intrusive.

The following steps 5 and 6 of the filtering method belong to the third phase of the algorithm which deals with the analysis of the provisionally rejected cycles and of the « restoration » phase of the operation model of each piece of household equipment. This last phase will give the final classification of the household equipment belonging to the studied class.

Step 5 (FIG. 4): Restoration of the Complete Set of Cycles for Each Piece of Household Equipment This step consists in finding the missing cycles for one given piece of household equipment in order to be able, at the end of the step of restoration of the cycles, to calculate the total consumption of this piece of household equipment during the period of analysis. This piece of household equipment corresponds to one line of the ECv matrix of the valid cycles.

During the step of restoration, the algorithm of the method according to the invention browses the ECr set of rejected cycles for each piece of household equipment, in order to search for the power variations corresponding to the cycles which have first been rejected, but which belong to a sub-set of the partition, considering the values of the criteria resulting from the step of learning.

Considering the various power and time criteria resulting from the learning, a restoration phase is defined with its own criteria and thresholds for each class. The restoration phase is iteratively applied to all the sub-sets (thus the household equipment) created with the learning phase.

Each algorithm of one class founds its restoration phase on the principle of a multi-criterion decision aid method, more particularly of the AHP, acronym for « Analytic Hierarchy Process » type. This kind of method is known to the persons skilled in the art and will not be described in details.

The flowchart of a restoration algorithm using the AHP method applied to the example of the « Pump » class is shown, simply as an example in FIG. 5.3.

As seen above, the « Pump » class has power variations cycles characterised by three power variations: $\Delta P1>0$, $\Delta P2<0$ and $\Delta P3<0$.

Then the cycles having a first positive power variation $\Delta P1$ are extracted from the set of the provisionally rejected cycles for the « Pumps » class, in 80. Among these cycles, the set of cycles, the values of the information vector of which corresponds to the values of the power and time criteria resulting from the step of learning are selected in 81. The other cycles are again re-injected, in 82, into ECr.

Then the cycles having a second negative power variation are extracted from the ECr set of the provisionally rejected cycles, in 83, and they are combined, in 84, with the already extracted cycles, on the basis of their first valid power variation $\Delta P1$. Then, in 85, a set of cycles is formed, the first and second power variations $\Delta P1$, $\Delta P2$ of which are compatible with the values resulting from the step of learning. In 86, the cycles the second power variation of which is not compatible, are re-injected into ECr in 87.

In 88, 89, 90, 91, this method is repeated for the third power variations $\Delta P3$, so as to obtain in 92 only the cycles for which the variations $\Delta P1$, $\Delta P2$ and $\Delta P3$ are consistent with the values of the criteria resulting from the learning phase. Such provisionally rejected cycles are then chronologically reintegrated into the provisional sub-set of the cycles of this piece of household equipment, so as to form a restored or definitive sub-set de cycles for this piece of household equipment.

The same is true for all the household equipment in one class, then for all the classes. Then the provisionally rejected cycles are progressively removed from the Ecr set. Upon completion of the processing for one class, only a few residual cycles remain for this class, which have not been affected in the operation model of one piece of household equipment in this class. Such residual cycles are then re-injected into the global set of provisionally rejected cycles, in order to take part in the restoration process for another class, and so on.

Upon completion of the restoration process for the last class of household equipment, only power variation cycles which could not be allocated to one piece of household equipment in any class remain in all the rejected cycles. Such cycles are then affected to the « Other » consumption class.

It must be noted that all the definitely validated cycles for all household equipment in one class, correspond to the total identified consumption for this class of household equipment, which makes it possible to calculate and to represent the part of consumption in this class in the global load curve.

Step 6 (FIG. 4): Final Classification and Updates

For each class of household equipment, the algorithm updates each cycle sub-sets with the missing cycles which have been restored. The class is completed with the updating of the missing cycles and the size of the ECr set is reduced. Upon completion of the total filtering process, the «Other» class obtained must be as small as possible. From this final classification, algorithm also updates the information vectors stored in the memory.

Finally, all the steps of the filtering algorithms aim at producing a reliable classification of the household equipment belonging to the same class and at minimising the size of the «Other» class, i.e. the number of power events not allocated to one class of household equipment or to one piece of household equipment.

Definition of the Power and Time Criteria and of the Thresholds Thereof.

For each sub-set of the classification made in the first part of the algorithm (filtering of the load curve), the power and time criteria take values called «thresholds». The definition or the calculation of these thresholds enables the algorithm to make a choice with respect to a power variation belonging to the set of rejected cycles.

As was seen above, the thresholds are of different natures: there are fixed thresholds and thresholds self-adapting during the execution of the algorithm.

Fixed Thresholds:

These thresholds are fixed as a function of the acquired experience thanks to the study of a reference base of household equipment and the consumption thereof in operation. Such fixed thresholds are invariants of the studied class. They will be applied to some criteria of the class, and they will remain unchanged, whatever the sub-set of studied cycles. Such thresholds are in the form of a value interval. The definition of an interval of possible values gives the algorithm some flexibility for analysing the characteristics of a power variation, so as to prevent any arbitrary selection which might result in misclassifications.

Self-Adapting Thresholds:

These are thresholds calculated during the learning phase, using simple statistical tools applied to some criteria of the class. They are thus characteristic of the sub-set of cycles studied.

In the case of the «Pump» class, the self-adapting thresholds are for example:

the average of the power variations of the first cycle power variation, noted mean ($\Delta P_1$);

the average of the power variations of the second cycle power variation, noted mean ($\Delta P_2$);

the average delay between the first and the second power variation noted mean ($\Delta T_1$);

Most thresholds are used in the phase of reconstruction of the cycles, as combinations between the fixed and the self-adapting thresholds. Such combinations make it possible to take into account, for each analysed power variation, the characteristics of the cycles sub-set, and also the general characteristics of the studied class.

The table herein under gives an example of the nature, les values of the thresholds, and the criteria used in the algorithm of the «Pumps». Of course, the corresponding criteria and thresholds vary as a function of each class of household equipment and can easily be determined by the persons skilled in the art.

TABLE 3 criteria and thresholds associated with the «Pump» algorithm.

| Criterion | Nature of the threshold | Value of the threshold |
|---|---|---|
| (1) $\Delta PT = \sum_{i=1}^{Z} Pi$ | Fixed | [−40 w, 40 w] |
| (2) ($\Delta P_1$) | Fixed and self-adapting | [mean($\Delta P_1$) − 200 W, mean($\Delta P_1$) + 200 W] |
| ($\Delta P_1$) | | [mean($\Delta P_2$) − 250 W, mean($\Delta P_2$) + 200 W] |
| ($\Delta P_2$) | | [mean($\Delta P_2$) − 50 W, mean($\Delta P_3$) + 50 W] |
| ($\Delta T_3$) | | [mean($\Delta T_3$) − 5 min, mean($\Delta T_3$) + 10 min] |
| (3) ($\Delta P_1$) | Fixed and self-adapting | [mean($\Delta P_1$) − 700 W, mean($\Delta P_1$) + 700 W] |
| (4) ($\Delta P_2$) | Fixed and self-adapting | [mean($\Delta P_2$) − 250 W, mean($\Delta P_2$) + 200 W] |
| ($\Delta T_1$) | | [mean($\Delta T_1$) − 1 s, mean($\Delta T_1$) + 1 s] |
| (5) ($\Delta P_3$) | Fixed and self-adapting | [mean($\Delta P_3$) − 100 W, mean($\Delta P_2$) + 100 W] |
| ($\Delta T_3$) | | [mean($\Delta T_3$) − 5 min, mean($\Delta T_3$) + 15 min] |
| (6) $\sum_{i=1}^{Z} Pi$ | Fixed and self-adapting | [−40 w, 40 w] [mean($\Delta T_A$) − 10 min, mean($\Delta T_A$) + 10 min] Number of cycles > 5 |
| ($\Delta T_4$) Number of cycles | | |

The function of the self-adapting thresholds consists in enabling the algorithm to adapt to the load curve and to the actual household equipment present. Consequently, there is no rigid rule of decision but rather value intervals giving flexibility to the selection of the power variations.

The definition of the criteria and of the associated thresholds, for each algorithm, makes the filtering process both consistent and particular, since the filtering principle remains the same for each class, but each algorithm has some own characteristics because of the self-adapting thresholds.

This duality makes it possible to reach a classification of the household equipment without any information outside the system, only from the load curves.

With each load curve, learning files are more complete as regards the analysed information, and make it possible to refine the criteria thresholds.

Advantages of the Invention

The invention remedies the problem met and reaches the desired aims. Thanks to the definition of classes of electric household equipment as a function of the consumption characteristics thereof (cycles of consumed power variation as a function of time), the invention revealed that it is possible to create an iterative process able to extract the power and time signatures for each class of household equipment, and to distribute the household equipment of the site into several predefined classes, simply by filtering the global load curve, without any other prior information on the household equipment, provided however that a set of classes defined from a reference base of electric household equipment is available.

If the analysis of the power cycles of the load curve does not make it possible to precisely identify a given piece of household equipment in a class of household equipment, it enables to assign each piece of household equipment of the consumption site to one of the predefined classes, which makes it possible to distribute the global consumption between the classes of household equipment present on the site. This more particularly makes it possible to detect classes of household equipment which consume most, and consequently to take corrective measures on the site, in order to reduce the consumption of a class of household equipment, and/or the global consumption of the site.

Experience showed that, unlike the existing methods, the method according to the invention makes it possible to obtain a rate of consumption allocation to a class of household equipment, above 85% on an average, and above 70% in any case.

It is also important to note that the implementation of the method and of the device according to the invention is absolutely not intrusive toward the site user, which guarantees its efficiency and the taking into account of the consumption distribution performed.

The implementation of the method according to the invention simply requires the implementation of a simple electronic box positioned close to the electric counter of the site, and provided with software making it possible to acquire the load curve and to filter it as described above, it being understood that the processing itself can be carried out locally on the site, or remotely, in a centralized way.

The invention claimed is:

1. A method for analysing the electric consumption of a plurality of electric household equipment operated on a consumption site, by filtering a load curve representing the electric consumption of said household equipment as a function of time, comprising the following steps:
    prior to the filtering of the load curve:
        save and digitize the load curve, so as to obtain a digitized load curve by periods of time;
        define a set of classes of household equipment, with each class being defined by similar power variation cycles;
        define for each class of household equipment, an algorithm for filtering the load curve dedicated to said class of household equipment, with said algorithm being able to extract power variation cycles from the digitized load curve, and to allocate it to said class of household equipment; and
    during the filtering of the digitized load curve:
        successively use the filtering algorithms dedicated to each class of household equipment for identifying and grouping, from the digitized load curve, the variation cycles of the power consumed by the electric household equipment;
    wherein the digitized load curve is successively filtered using a specific algorithm for each class of household equipment, according to a sequenced succession of filtering algorithms, and wherein the step of filtering of the digitized load curve for a given class of household equipment includes the following operations:
        search for, and extraction from the load curve of the power variation cycles characteristic of a given class of household equipment;
        distribution of the extracted cycles between a set of valid cycles and a set of provisionally rejected cycles;
        creation of a provisional partition composed of incomplete sub-sets of valid cycles, with each incomplete sub-set including cycles of only one piece of household equipment;
        local learning from the valid cycles of each provisional partition, so as to define criteria characteristic of the valid cycles;
        from the criteria resulting from the local learning, restoration of the chronological model of operation of each piece of household equipment, by allocating it previously provisionally rejected power variation cycles;
        updating the classification and the learning according to the step of restoration, so as to create a final partition of the extracted cycles, with each partition corresponding to the consumption of a piece of household equipment; and
    subsequent to the filtering of the digitized load curve, reducing a consumption of one or more of the classes of household equipment.

2. A method according to claim 1, wherein said criteria used for the validation and the distribution of the extracted cycles, then for the creation of a provisional partition of sub-sets of valid cycles and for the local learning of the valid cycles of each provisional partition, are power and time criteria, characteristic of the valid cycles.

3. A method according to claim 2, wherein, in order to validate the extracted cycles for a given class of household equipment, the power and time characteristics of the extracted cycles are compared with the power and time criteria defined for this class, and those of the cycles which have power and time characteristics incompatible with the fixed criteria are provisionally rejected, the other cycles are definitively validated as belonging to a piece of household equipment of a given class.

4. A method according to claim 2, wherein the creation of a provisional partition composed of incomplete sub-sets of valid power variation cycles for each piece of household equipment includes steps comprising grouping the valid power variation cycles having substantially the same values for the power and time criteria, so that each group of cycles represents the cycles of a piece of household equipment of a class having been operated on the load curve, then in representing the provisional partition as a matrix of information where each line represents one piece of household equipment and each column contains the valid extracted cycles belonging to the household equipment.

5. A method according to claim 2, wherein the step of learning comprises calculating the values of a set of power and time criteria associated with the valid cycles of each piece of household equipment, then in making a statistical analysis of these values, and in storing the obtained statistics in a memory, as an information vector associated with each piece of household equipment.

6. A method according to 2, wherein the step of restoration comprises restoring, for each piece of household equipment, the set of the power variation cycles for this piece of household equipment between the turning on and off thereof, by chronologically integrating in the set of the valid cycles of such piece of household equipment, cycles selected from the set of provisionally rejected cycles, with such selection being made using criteria and thresholds resulting from the step of learning.

7. A method according to claim 2, wherein the step of creating a final partition comprises updating each sub-set of cycles representing a piece of household equipment of the filtered class, with the missing cycles as restored during the step of restoration.

8. A method according to claim 2, wherein the power and time criteria are self-adapting and vary from one load curve to another.

9. A method according to claim 2, further comprising a step of aggregating the electric consumptions of each class of household equipment from the final partition of the extracted cycles, so as to produce a summary report indicating the electric consumption, or the proportion of electric consumption, of the household equipment of each class during a consumption analysis period.

10. A method according to claim 1, wherein the step of search for and extraction of the power variation cycles characteristic of a given class of household equipment, comprises defining characteristic binary codes corresponding to the power variations of such class of household equipment, then in subtracting from the digitized load curve, the thus defined characteristic binary codes and in classifying these either in a set of valid cycles corresponding to the model of operation of a piece of household equipment, or in a set of provisionally rejected cycles, then in re-injecting the provisionally rejected cycles into the load curve prior to searching for the power variation cycles relative to another class of household equipment.

11. A method according to claim 1, wherein the load curve is digitized by periods of time equal to or under one second.

12. A method according to claim 1, wherein the set of predefined classes of household equipment includes at least one of the classes among the following ones:
    the class of electric pumps;
    the class of electric resistances;
    the class of microwave ovens;
    the class of large electric household equipment;
    the class of the other electric household equipment which is not concerned by one preceding class.

13. A method according to claim 12, wherein the class of electric pumps is defined by a power consumption variation cycle successively including a first positive power variation, a second negative power variation, and a third negative power variation.

14. A method according to claim 12, wherein the class of large electric household equipment is defined by a power consumption variation cycle successively including at least four power variations, i.e. a first positive power variation, a second negative power variation, a third positive power variation, and a fourth negative power variation.

15. A method according to claim 12, wherein the class of microwave ovens is defined by four types of distinct power variation cycles, with the first type of cycle comprising a positive power variation followed by a negative variation, with the second type of cycle comprising two positive variations followed by a negative variation, with the third type of cycle comprising a positive variation followed by two negative variations, and the fourth type of cycle comprising two successions, each composed of a positive variation followed by a negative variation.

16. A method according to claim 12, wherein the class of electric resistances is defined by a power consumption variation cycle successively comprising a first positive power variation followed by a second negative power variation.

17. A method according to claim 16, comprising successively implementing the filtering algorithm relative to the class of pumps, then the filtering algorithm relative to the class of microwave ovens, then the filtering algorithm relative to the class of large electric household equipment, then the filtering algorithm relative to the class of resistances.

18. A method according to claim 1, wherein the steps of acquisition of the load curve and of filtering the load curve are carried out locally on the consumption site.

19. A method according to claim 1, wherein the step of acquisition of the load curve is carried out locally, and binary values representing the load curve are then transmitted to a remote processing centre where the steps of filtering the load curve are carried out.

20. A processing device intended to be connected to the electric supply line of a consumption site, wherein the device includes a non-transitory computer readable recording medium having a program stored therein that causes the processing device to execute the method according to claim 1.

* * * * *